United States Patent
Reisman et al.

(10) Patent No.: US 10,580,637 B2
(45) Date of Patent: Mar. 3, 2020

(54) COLOR-SHIFTED LAMPS USING NEODYMIUM-FLUORINE CONTAINING COATING

(71) Applicant: GE LIGHTING SOLUTIONS, LLC, East Cleveland, OH (US)

(72) Inventors: Juliana P. Reisman, Beachwood, OH (US); William Robert Wright, Russell, OH (US); Jianmin He, Orange, OH (US); Dengke Cai, Mentor, OH (US); Jenna Marie Baldesare, Lyndhurst, OH (US)

(73) Assignee: CONSUMER LIGHTING (U.S.), LLC, Norwalk, CT (US)

( * ) Notice: Subject to any disclaimer, the term of this patent is extended or adjusted under 35 U.S.C. 154(b) by 0 days.

(21) Appl. No.: 14/931,476

(22) Filed: Nov. 3, 2015

(65) Prior Publication Data
US 2016/0099141 A1 Apr. 7, 2016

Related U.S. Application Data

(63) Continuation-in-part of application No. 14/876,366, filed on Oct. 6, 2015, and a continuation-in-part of
(Continued)

(51) Int. Cl.
*H01J 61/40* (2006.01)
*H01J 61/02* (2006.01)
(Continued)

(52) U.S. Cl.
CPC ............... *H01J 61/40* (2013.01); *H01J 9/20* (2013.01); *H01K 1/32* (2013.01); *H01J 61/025* (2013.01)

(58) Field of Classification Search
None
See application file for complete search history.

(56) References Cited

U.S. PATENT DOCUMENTS 2,188,298 A * 1/1940 Hitchcock ................. H01J 5/32
174/17.07
3,505,239 A * 4/1970 Robert .................... H01S 3/093
252/301.4 P
(Continued)

FOREIGN PATENT DOCUMENTS

JP 51-58444 A 5/1976
JP S-51-56851 A 5/1976
(Continued)

OTHER PUBLICATIONS

Reben, Manuela, et al. "Nd3+-doped oxyfluoride glass ceramics optical fibre with SrF." Optica Applicata 42.2 (2012).*
(Continued)

*Primary Examiner* — Walter H Swanson
*Assistant Examiner* — Kien C Ly
(74) *Attorney, Agent, or Firm* — Wood IP LLC

(57) ABSTRACT

The specification and drawings present a new apparatus such as a halogen incandescent lamp is presented herein, the apparatus comprising a light source such as a light-generating element made of tungsten, configured to generate a visible light such as white light having chromaticity coordinates of the light source in a clear center in a color space, and a component such as light-transmissive envelope, enclosing the light source and comprising a coating with a compound comprising elements of neodymium and fluorine and configured to provide a desired light spectrum by filtering the generated visible light using the compound, where the desired light spectrum having chromaticity coordinates in the color space being shifted from the clear center below the black-body locus and outside of a four-step
(Continued)

MacAdam ellipse of the light source to meet a predefined requirement for a modified spectrum lamp.

19 Claims, 4 Drawing Sheets

Related U.S. Application Data application No. PCT/CN2014/088116, filed on Oct. 8, 2014.

(60) Provisional application No. 62/061,129, filed on Oct. 7, 2014.

(51) Int. Cl.
*H01J 1/12* (2006.01)
*H01J 9/20* (2006.01)
*H01K 1/32* (2006.01)

(56) References Cited

U.S. PATENT DOCUMENTS

| | | | | |
|---|---|---|---|---|
| 4,005,324 A * | 1/1977 | Dolenga | ................ | H01K 1/50 313/579 |
| 4,395,653 A * | 7/1983 | Graff | ................ | H01K 1/32 313/112 |
| 4,441,046 A * | 4/1984 | James | ................ | H01J 9/20 313/112 |
| 4,633,127 A * | 12/1986 | Beurskens | ................ | H01K 1/32 313/112 |
| 4,636,072 A * | 1/1987 | Yahraus | ................ | G01J 1/08 356/121 |
| 5,252,887 A | 10/1993 | Reisman | | |
| 8,389,958 B2 | 3/2013 | Vo-Dinh et al. | | |
| 2012/0063151 A1 * | 3/2012 | Juestel | ................ | C01F 7/166 362/311.03 |
| 2014/0191653 A1 | 7/2014 | Edmond et al. | | |
| 2014/0226335 A1 * | 8/2014 | Menkara | ................ | F21V 9/16 362/259 |
| 2014/0257439 A1 * | 9/2014 | Douglas | ................ | A61N 5/0618 607/90 |
| 2014/0268794 A1 * | 9/2014 | Donofrio | ................ | F21V 9/08 362/293 |
| 2015/0109758 A1 | 4/2015 | Allen et al. | | |
| 2015/0188006 A1 * | 7/2015 | Williams | ................ | H01L 33/56 257/98 |
| 2015/0252953 A1 | 9/2015 | Progl et al. | | |
| 2015/0279651 A1 | 10/2015 | Reisman et al. | | |
| 2016/0097496 A1 | 4/2016 | Allen et al. | | |
| 2017/0037308 A1 * | 2/2017 | Romer | ................ | H01L 33/44 |

FOREIGN PATENT DOCUMENTS

| | | |
|---|---|---|
| JP | 58225148 A | 12/1983 |
| JP | 04194803 A | 7/1992 |
| JP | 5156581 B2 | 3/2013 |
| JP | 5158444 B2 | 3/2013 |
| WO | 2016089810 A1 | 6/2016 |
| WO | 2016195938 A1 | 12/2016 |

OTHER PUBLICATIONS

Reben et al: Reben, Manuela, et al. "Nd3+-doped oxyfluoride glass ceramics optical fibre with SrF." Optica Applicata 42.2 (2012).*
Beaury, Laure, et al. "Neutron powder diffraction studies of stoichiometric NdOF between 1.5 and 300 K." Solid state sciences 4.8 (2002): 1039-1043.*
International Search Report and Written Opinion issued in connection with corresponding PCT Application No. PCT/US2016/065149 dated Feb. 27, 2017.
U.S. Non-Final Office Action issued in connection with related U.S. Appl. No. 14/966,329 dated Apr. 29, 2016.
Gary Robert Allen et al., filed Oct. 6, 2015, U.S. Appl. No. 14/876,366.
Kevin Jeffrey Benner et al., filed Dec. 11, 2015, U.S. Appl. No. 14/966,329.

* cited by examiner

COLOR-SHIFTED LAMPS USING NEODYMIUM-FLUORINE CONTAINING COATING

CROSS-REFERENCE TO RELATED APPLICATIONS

This application is a continuation-in-part of copending, commonly owned U.S. patent application Ser. No. 14/876,366, filed 6 Oct. 2015, which claims benefit of priority under 35 USC 119(e) of U.S. provisional application 62/061,129, filed 7 Oct. 2014. The teachings of U.S. patent application Ser. No. 14/876,366 are incorporated herein by reference. This application is a continuation-in-part of copending, commonly owned International Application PCT/CN2014/088116, filed 8 Oct. 2014, the teachings of which are incorporated herein by reference.

TECHNICAL FIELD

The invention generally relates to lighting systems and related technologies. More particularly but not exclusively, this invention relates to lamps that exhibit a chromaticity shift relative to a clear baseline using coatings with compounds comprising neodymium (Nd) and fluorine (F), including but not limited to halogen incandescent lamps capable of meeting the definition of a modified spectrum lamp.

BACKGROUND OF THE INVENTION

As known in the art, halogen incandescent lamps, also referred to as tungsten halogen lamps, generally resemble other types of incandescent lamps, but differ in part in that the outer glass jacket (envelope) of a halogen lamp encloses a capsule in which a light-generating element, commonly referred to as a filament, is contained. The capsule also typically contains an inert gas, for example, krypton, xenon, and/or argon, and a small amount of a gaseous halogen species, for example, a bromine compound. The halogen species achieves a halogen cycle chemical reaction within the capsule that is capable of increasing the life of the filament, enables higher operating temperatures, and can promote certain lighting characteristics as compared to other types of incandescent lamps.

Because incandescent lamps are generally less efficient than other types of lighting, for example, compact fluorescent lamps (CFL) and light-emitting diodes (LED) lamps, governing authorities have taken steps to mandate increased efficiencies for lamps. An example is the Energy Independence and Security Act (EISA) of 2007, which sets luminosity requirements within the U.S.A. for given lamp wattages and categories of lamps, effectively mandating minimum standards for energy efficiency measured in the industry on the basis of lumens per watt (LPW) of electricity input to the lamp.

A "modified spectrum" lamp is a category of general service incandescent lamps defined by the EISA. According to the EISA definition, the modified spectrum lamp is a type of incandescent lamps that is intended for general service lighting applications and not sufficiently saturated in color to be categorized as a colored incandescent lamp. FIG. 1 utilizes what is referred to in the art as the CIE (Commission Internationale d'Eclairage) 1931 color space chromaticity diagram to illustrate the requirements of the modified spectrum lamp in terms of a color space relative to a clear ANSI (American National Standards Institute) A19-type incandescent lamp that serves as a "clear center." As used herein, a "clear center" 10 in FIG. 1 refers to the light emitted by a "clear baseline lamp" that lacks any doping such as clear A19 lamp, coating, or other treatment that alters the color of the white light emitted by the lamp filament. As known in the art, a color space is a mathematical model of how colors can be represented as values in an x-y coordinate system, and a MacAdam ellipse (oval) refers to a region in the color space in which the colors are indistinguishable by the human eye. A modified spectrum lamp must have chromaticity coordinates (CCx and CCy), as shown in FIG. 1, below a black-body locus 12 and outside the four-step MacAdam ellipse 14 of the clear baseline lamp. If a lamp meets the requirements to be considered a modified spectrum lamp, the EISA reduces its luminosity requirement for a given wattage by 25%. As such, an incandescent lamp that meets the definition of a modified spectrum lamp can provide for the possibility of a much wider range of applications and/or design possibilities because of the relatively more lenient luminosity requirements for such a lamp.

Modified spectrum lamps have been produced to have an outer jacket formed of a glass modified to filter certain wavelengths of light. A notable example is a neodymium oxide (neodymia, $Nd_2O_3$) doped glass used in the REVEAL line of incandescent bulbs commercially available from GE Lighting. A different approach is to apply a pigment-doped coating on the interior of the outer jacket. Though predating the EISA definition of the "modified spectrum" lamp, an example of such a coating is disclosed in U.S. Pat. No. 5,252,887 by Reisman and, under the existing definition, would result in a modified spectrum lamp if applied to an appropriate coating thickness. These concepts are known in the art, but are generally lacking in their ability to provide modified spectrum conditions for a broad range of incandescent lamps, both in terms of visual appearance and spectral power distribution. In addition, these approaches may be cost prohibitive or reduce the luminosity of the lamp to what may be an impractical extent.

SUMMARY OF THE INVENTION

According to an aspect of the invention, an apparatus comprising: a light source, configured to generate a visible light having chromaticity coordinates of the light source in a clear center in a color space; and a component enclosing the light source and comprising a coating with a compound comprising elements of neodymium (Nd) and fluorine (F) and configured to provide a desired light spectrum by filtering the generated visible light using the compound, wherein the desired light spectrum having chromaticity coordinates in the color space being shifted from the clear center below a black-body locus and outside of a four-step MacAdam ellipse of the light (thus meeting a definition for a modified spectrum lamp).

According further to the aspect of the invention, the light source may comprise a light-generating element made of tungsten (W).

Still further according to the aspect of the invention, the apparatus may comprise a modified-spectrum halogen incandescent lamp. Further, the component may be a light-transmissive envelope, and the modified-spectrum halogen incandescent lamp comprises an inert gas and halogen species in a capsule enclosed with the light-transmissive envelope. Still further, the inert gas may comprise at least one of xenon and krypton.

According further to the aspect of the invention, the component may be a light-transmissive envelope made of a glass material.

According still further to the aspect of the invention, the compound may comprise $Nd^{3+}$ ions and $F^-$ ions. Further, the compound may comprise one or more of Nd—F and Nd—X—F compounds, wherein X is one or more of elements O, N, S, Cl, OH, Na, K, Al, Mg, Li, Ca, Sr, Ba and Y. Still further, the compound may be a mixture of the one or more of Nd—F and Nd—X—F compounds and one or more fluidizers. Yet still further, the one or more fluidizer may be one or more of AEROSIL R 972 V and AEROSIL OX 50. Further still, the compound may be at least one of $NdF_3$, NdOF and $Nd_4O_3F_6$.

According further to the aspect of the invention, a weight percentage of the compound in the coating may be about 80%.

According further to the aspect of the invention, the coating may be deposited on an inner surface of the component. Further, a thickness of the coating may be in a range from about 0.5 to about 4.0 $mg/cm^2$.

Still further according to the aspect of the invention, the coating may be deposited onto the component by an electrostatic coating method. Further, the coating may further comprise one or more color powders, wherein one of the one or more color powders may be a blue color powder.

According further to the aspect of the invention, the coating may further comprise a scattering additive having a higher refractive index than the compound, and wherein the additive is selected from metal oxides and non-metal oxides. Further, the additive may be selected from the group consisting of $TiO_2$, $SiO_2$ and $Al_2O_3$.

According yet further still to the aspect of the invention, the coating may be configured to provide improvement of light parameters of the apparatus including one or more of color saturation index (CSI), color rendering index (CRI), color rendering value R9 and revealness (lighting preference index, LPI).

BRIEF DESCRIPTION OF THE DRAWINGS

These and other features and aspects of the present disclosure will become better understood when the following detailed description is read with reference to the accompanying drawings, in which like characters represent like parts throughout the drawings, wherein.

DETAILED DESCRIPTION

Figure 1:
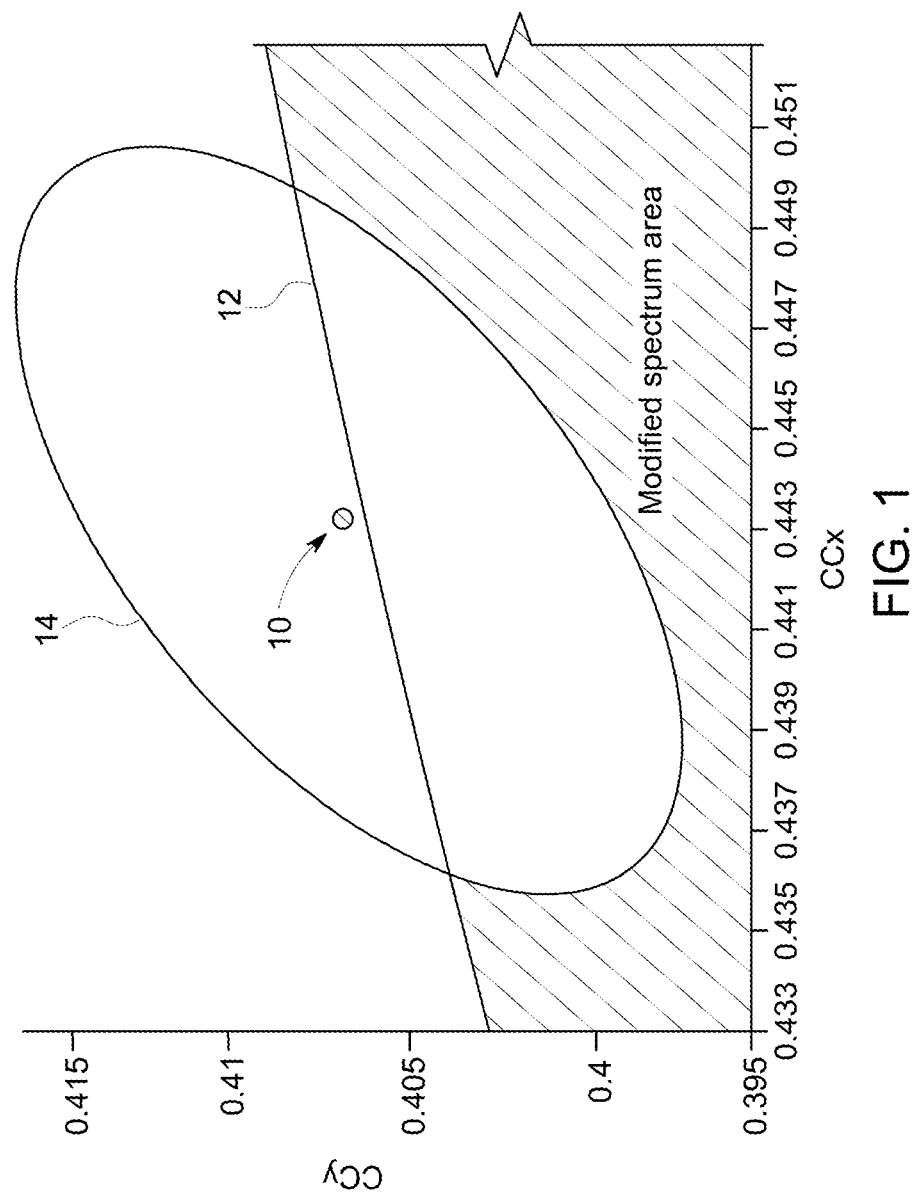
FIG. 1 is a chromaticity diagram illustrating requirements of a modified spectrum lamp in terms of color space relative to a clear incandescent lamp baseline.

In light of the above introduction, there are ongoing efforts to develop lamps that meet the definition of a modified spectrum lamp. As disclosed in commonly owned, co-pending US patent application publication US-2015/0279651, published on 1 Oct. 2015, the teachings of which are incorporated herein by reference in pertinent part, one methodology may include lamps exhibiting a chromaticity shift relative to a clear baseline, including but not limited to modified spectrum lamps. Such a lamp may include a light-transmissive envelope and a light-generating element enclosed within the light-transmissive envelope. The light-transmissive envelope can be doped to contain neodymium oxide ($Nd_2O_3$) and can have a coating on its interior envelope surface that contains at least one color pigment. Visible light emitted by the light-generating element has chromaticity coordinates corresponding to a clear center of a clear baseline lamp. The light-transmissive glass envelope has a neodymium oxide content and the coating has a color pigment content that in combination cause visible light emitted through the light-transmissive envelope to have chromaticity coordinates that are shifted from the chromaticity coordinates of the visible light emitted by the light-generating element. The chromaticity coordinates of the visible light emitted through the light-transmissive envelope are below a black-body locus and outside of a four-step MacAdam ellipse of the clear baseline lamp.

A new apparatus such as a lighting apparatus including a halogen incandescent lamp is presented herein, the apparatus comprising at a light source such as a light-generating element made of tungsten (W), configured to generate a visible light such as white light having chromaticity coordinates of the light source in a clear center in a color space, and a component such as light-transmissive envelope, enclosing the light source and comprising a coating with a compound comprising elements of neodymium (Nd) and fluorine (F) and configured to provide a desired light spectrum by filtering the generated visible light using the compound, where the desired light spectrum having chromaticity coordinates in the color space being shifted from the clear center below a black-body locus and outside of a four-step MacAdam ellipse of the light source to meet a predefined requirement for a modified spectrum lamp such as the EISA definition for a modified spectrum lamp.

Typically the compound comprising elements of neodymium (Nd) and fluorine (F) comprises $Nd^{3+}$ ions and $F^-$ ions. For the purpose of this invention, the "Nd—F compound" should be broadly construed to include compounds comprising neodymium and fluoride and optionally other elements. For example, such compound may be neodymium fluoride ($NdF_3$), variations of neodymium oxyfluoride (e.g., NdOF, $Nd_4O_3F_6$ and the like), or neodymium fluoride comprising adventitious water and/or oxygen, or a neodymium hydroxide fluoride (e.g., $Nd(OH)_aF_b$ where a+b=3).

In further embodiments, the Nd—F compounds comprising other elements may be generalized as a Nd—X—F compound or a combination of Nd—F and Nd—X—F. In one embodiment, X can be at least one element selected from the group consisting of: elements that form compounds with neodymium, such as, oxygen (O), nitrogen (N), sulfur (S), chlorine (Cl) and the like. In another embodiment, X may be at least one metallic element that form compounds with fluorine, such as Na, K, Al, Mg, Li, Ca, Sr, Ba, and Y, or combinations of such elements, such metallic elements being different from neodymium. Particular examples of Nd—X—F compounds may include: neodymium oxyfluoride (Nd—O—F) compound; Nd—X—F compounds in which X may be Mg and Ca or may be Mg, Ca and O; as well as other compounds containing Nd—F, including perovskite structures doped with neodymium. Certain Nd—

X—F compounds may advantageously enable broader absorption at wavelengths of about 580 nm.

Figure 2:
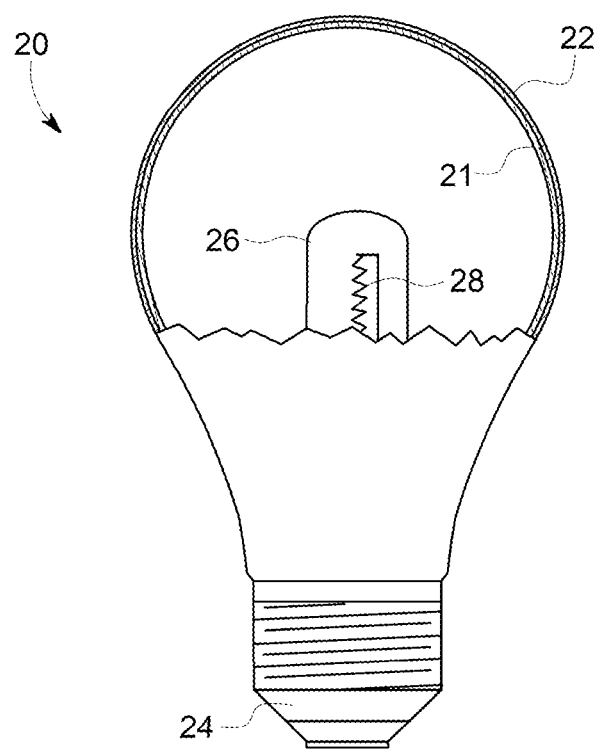
FIG. 2 is a cross sectional view of a halogen incandescent lamp/apparatus, according to various embodiments of the invention.

FIG. 2 is a non-limiting example of a cross sectional view of a halogen incandescent lamp/apparatus 20 comprising a coating 21, according to various embodiments of the invention. The lamp represents a halogen incandescent lamp (bulb) 20 of a type known in the art, such as ANSI A19-type incandescent lamp. The lamp 20 comprises an outer jacket (envelope) 22 connected to a base 24 in any suitable manner. The outer jacket 22 encloses a capsule 26 in which a filament 28 is provided along with a halogen-containing species and preferably a fill gas comprising an inert gas, for example, krypton, xenon, argon, or any mixtures thereof. Suitable halogen-containing species are capable of achieving a halogen cycle chemical reaction within the capsule 26, with non-limiting examples including elemental iodine and compounds of bromine, chlorine or fluorine, for example, $CH_3Br$, $CH_2Br_2$, HBr, and mixtures thereof. The filament 28 is can be made of tungsten (W), though it is foreseeable that the filament 28 could be made of or comprise other materials, for example, tantalum, carbon, or mixtures or composites thereof. The outer jacket 22 and capsule 26 can be formed of light-transmissive materials, non-limiting examples of which are glass materials and quartz (fused silica) capable of withstanding high temperatures over extended periods of time.

The lamp 20 and its components described above are useful for describing various embodiments of the present invention, though it should be appreciated that the invention is not limited to the lamp configuration represented in FIG. 2, and instead is applicable to various other lamp configurations that might benefit from the teachings disclosed herein. As a non-limiting example, the teachings disclosed herein are also believed to be applicable at least to light-emitting diode (LED) lamps, which generally comprise a light-transmissive envelope (dome) and a light-generating element (LED chip) enclosed within the envelope.

FIG. 2 schematically represents an interior (inner) surface of the jacket 22 (i.e., facing the capsule 16) as provided with a coating 21, represented as comprising a single discrete layer. It should be understood that FIG. 2 is drawn for purposes of clarity and simplicity, and therefore is not to scale nor intended to suggest that the coating 21 is limited to any particular number of layers or any particular thickness. The coating 21 can comprise Nd—F/Nd—X—F compound(s), as described herein, and is a factor in achieving certain illumination (spectral) properties desired for the lamp 20, and further to enable the lamp 20 to meet the EISA definition for a modified spectrum lamp.

The coating 21 comprising Nd—F and/or Nd—X—F compound(s) as described herein, may be applied electrostatically (e-coating) or by any other suitable process, serves to selectively shift the color of the visible light transmitted through the coating 21, thereby modifying the spectral power distribution and visual appearance of the visible light emitted by the lamp 21 and to meet the EISA definition for a modified spectrum lamp.

Many kinds of electrostatic coating processes are generally known in the lighting industry. As shown in FIG. 2, an inner surface of the jacket/bulb 22 is coated with the coating 21. Alternatively, the coating 21 can be coated on an outer surface of the bulb 22 which is typically transparent to the visible light. However, in another implementation, the jacket/bulb 22 may be made of a translucent material.

In order to use the e-coat process effectively, to obtain uniform appearance and appropriate thickness, for example, a powder of NdOF (or other suitable Nd—F/Nd—X—F materials) with a small particle size (e.g., less than 10 microns) can be used. Then the NdOF powder can be combined with a fluidizer, for example, by mixing them up in a blender, in order to lighten the overall powder mix to improve the quality of the e-coating (the mixture has to flow through a nozzle to deposit onto the bulb.) Two examples of fluidizers may be AEROSIL R 972 V and AEROSIL OX 50. Different fluidizers can be used alone or in combination. For example, both aforementioned fluidizers can be used in combination with NdOF powder in various combinations (% by weight), but typically the NdOF can be about 80% by weight and the fluidizers can be about 10% each. Optionally, additional powders may be added to change the lamp's appearance, for example, adding a blue color, a pink color or the like. One candidate for that can be FERRO V-3285, a blue powder. Since the traditional glass of a REVEAL lamp appears blue unlit, it may be desired to make the NdOF e-coat look bluer by adding some of this blue powder. It is noted that since the NdOF e-coat may be thin, the ANSI A19-type incandescent lamp may look mostly white from the outside, with just a hint of blue, when unlit. Once power is applied, though, the lit appearance is very similar to a Nd glass lamp.

There are many options/tradeoffs to consider in regard to the e-coat. NdOF is just one example of a base material, and a variety of Nd—F and/or Nd—X—F materials can be used instead or in addition, as described herein. Also a relative percentage of the base material, fluidizers and possibly other color powders may be variable. The thickness of the coating comprising the mix can also be a variable parameter as a compromise of different requirements. One of these requirements, as stated herein, is to meet the modified spectrum criteria by shifting the CCx and CCy appropriately in the color space, as explained in reference to FIG. 1. Another requirement may be achieving maximum "revealness", i.e., filtering the yellow colors as shown, e.g., in the example of FIG. 4 discussed below, by maximizing the coating thickness. On the other hand, a further requirement may be minimizing a lumen loss due to absorption of the light propagating through the jacket/bulb with the e-coating in order to meet the EISA 2007 criteria of the lumens/watts ratio. Thus, a design compromise in reference to a relative content of the mixture ingredients and a coating thickness may be necessary to meet all these requirements. Table 1 shows some design examples of Nd—F/Nd—X—F coating, such as NdOF, for different weight content and thickness for meeting the requirements described herein and reaching a workable trade-off compromise with design parameters such as CCx and CCy shifts, CRI shift and % lumen loss.

TABLE 1

Examples of NdOF coating demonstrating change of design parameters (CCx and CCy shifts, CRI shift and % lumen loss) of a coated lamp/bulb relative to an uncoated lamp/bulb.

| E-coat mix % NdOF by weight, with remaining % AEROSIL fluidizers | Amount applied to bulb [mg/cm$^2$] | Compared to Clear, Uncoated Bulb: | | | |
|---|---|---|---|---|---|
| | | CCx Shift | CCy Shift | CRI Shift | % Lumen Loss |
| 83.3 | 1.3 | −0.0062 | −0.0083 | −14 | −18% |
| 83.3 | 1.7 | −0.0076 | −0.0120 | −19 | −24% |
| 83.3 | 1.9 | −0.0074 | −0.0128 | −20 | −25% |
| 83.3 | 2.4 | −0.0084 | −0.0171 | −25 | −32% |
| 83.3 | 3.7 | −0.0082 | −0.0257 | −35 | −43% |
| 70.0 | 0.8 | −0.0002 | −0.0021 | −4 | −9% |

TABLE 1-continued

Examples of NdOF coating demonstrating change of design parameters (CCx and CCy shifts, CRI shift and % lumen loss) of a coated lamp/bulb relative to an uncoated lamp/bulb.

| E-coat mix % NdOF by weight, with remaining % AEROSIL fluidizers | Amount applied to bulb [mg/cm$^2$] | Compared to Clear, Uncoated Bulb: | | | |
|---|---|---|---|---|---|
| | | CCx Shift | CCy Shift | CRI Shift | % Lumen Loss |
| 70.0 | 1.3 | −0.0009 | −0.0051 | −9 | −15% |
| 70.0 | 1.7 | −0.0011 | −0.0079 | −13 | −22% |

Figure 3:
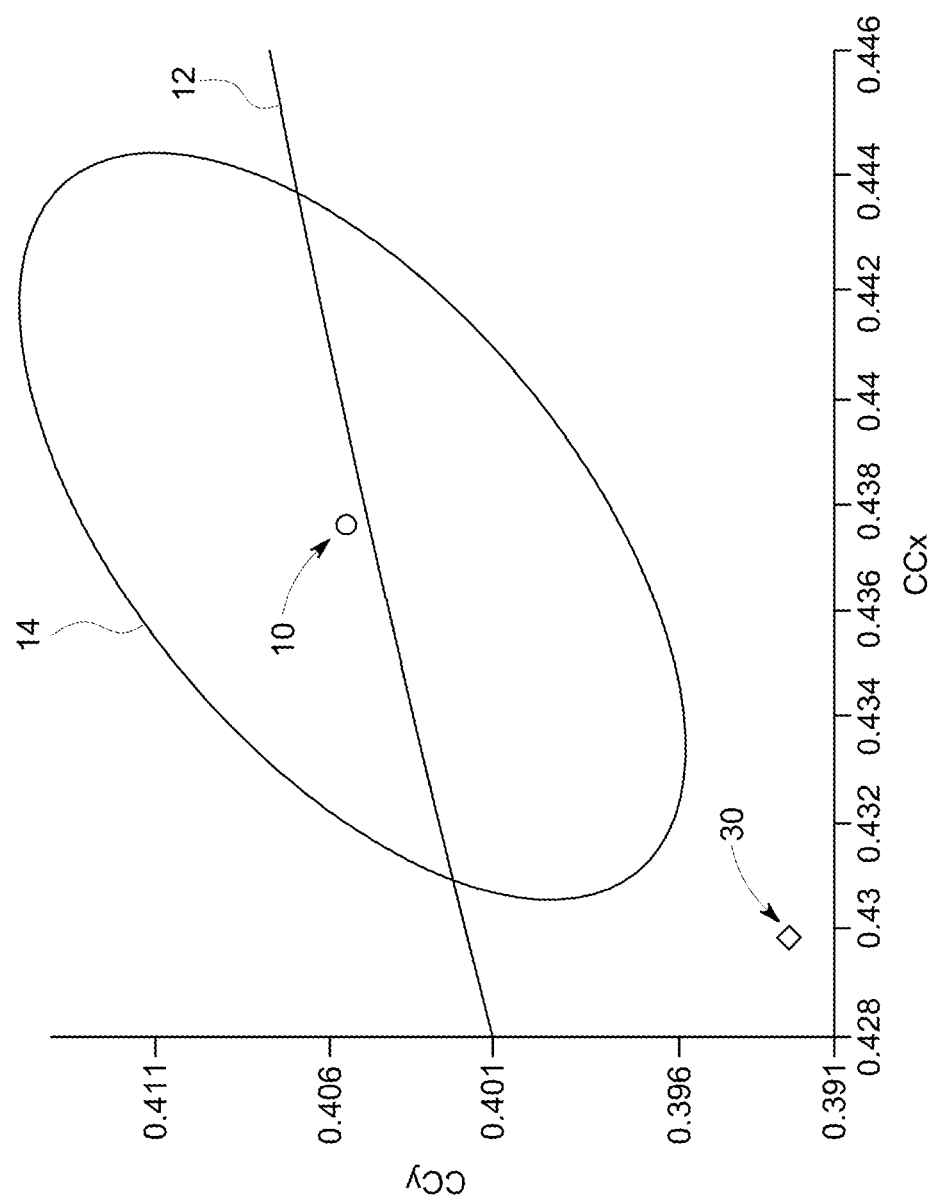
FIG. 3 is a chromaticity diagram similar to FIG. 1, but further illustrating results of halogen incandescent lamps including a clear baseline A19 lamp and a modified lamp provided with an enclosure coating comprising a NdOF compound, according to an embodiment of the invention.
Figure 4:
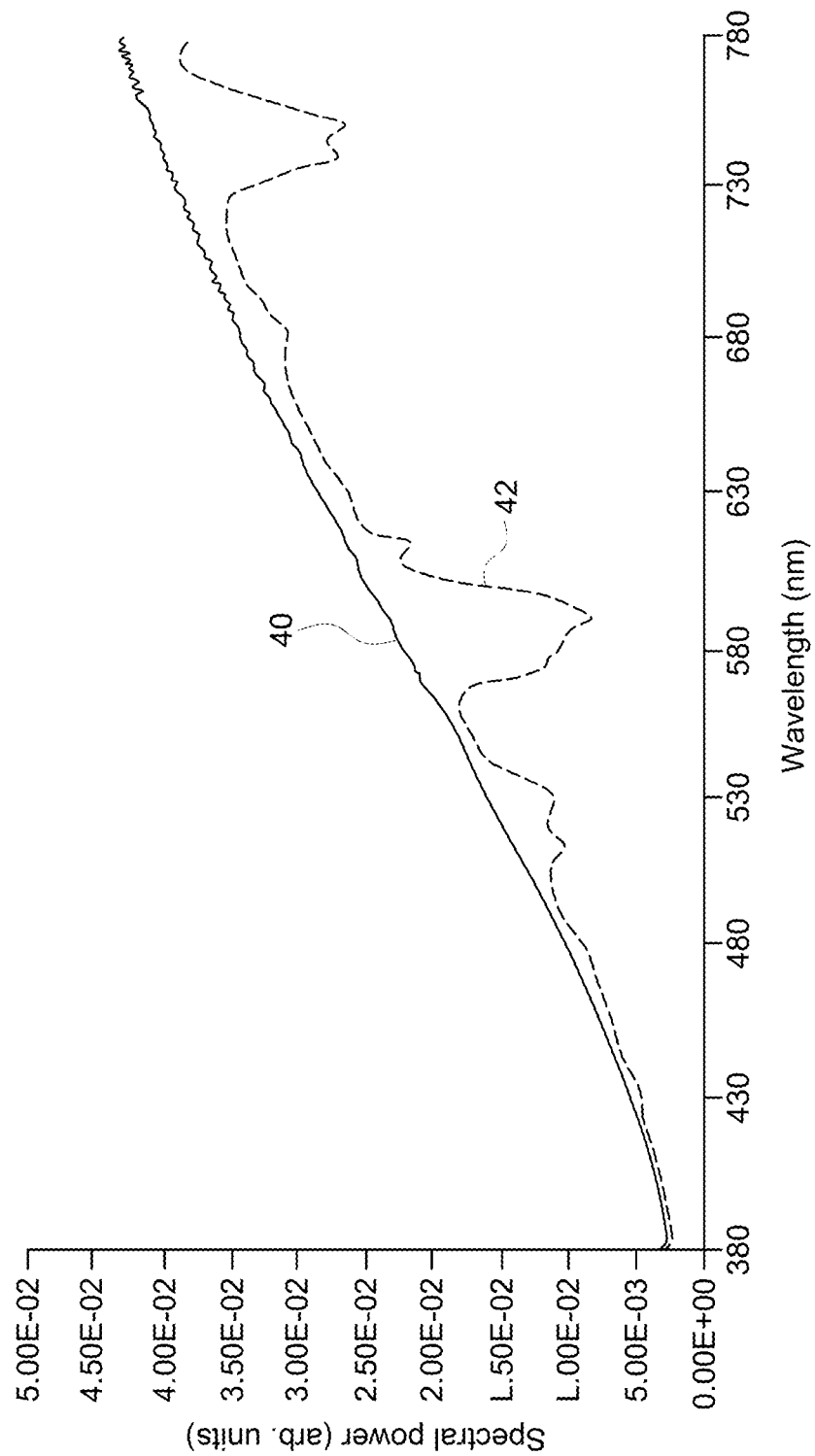
FIG. 4 is a spectral power distribution (SPD) plot showing spectral power distributions of halogen incandescent lamps including a clear baseline A19 lamp and a modified lamp provided with an enclosure coating comprising a NdOF compound, according to an embodiment of the invention.

FIGS. 3 and 4 demonstrate results for a modified halogen incandescent lamp with NdOF coating (e-coated) having the following parameters: e-coat mix component of $Nd_{0.96}Mg_{0.06}O_{0.75}F_{1.5}$ with % of total weight of 83.3%, AEROSIL R 972 V with % of total weight of 8.3% and AEROSIL OX 50 with % of total weight of 8.3%. This mix was applied to the bulb to a thickness corresponding to about 1.4 mg/cm$^2$.

FIG. 3 is a chromaticity diagram similar to FIG. 1, illustrating results of halogen incandescent lamps including a clear baseline A19 lamp with a "clear center" 10 and the four-step MacAdam ellipse 14 (as in FIG. 1) and of the modified halogen incandescent lamp provided with an enclosure coating comprising NdOF compound, according to an embodiment of the invention, described herein. A color shift to a modified color center 30 is provided by the NdOF coating to the modified spectrum area defined in FIG. 1 to meet the EISA definition/requirement of a "modified spectrum" lamp.

FIG. 4 is a spectral power distribution (SPD) plot showing spectral power distributions of halogen incandescent lamps including a clear baseline A19 lamp (curve 40) and the modified halogen incandescent lamp (curve 42) provided with an enclosure coating comprising the NdOF compound, according to another embodiment of the invention. It can be seen that the modified lamp provides a desired absorption peak in the yellow (e.g., about 570 nm to about 600 nm) region to filter yellow colors.

The presented results show that a similar filtering effect and color shift can be achieved with NdOF coating as with to $Nd_2O_3$ in the glass (disclosed in commonly owned, co-pending US patent application publication US-2015/0279651, published on 1 Oct. 2015), but at a fraction of the cost. The e-coat process by applying the NdOF (or Nd—F and/or Nd—X—F compounds) is also advantageous because the amount of filtering is much more easily controlled in this case than with the Nd in the glass. Also this approach can provide a great cost improvement because much less of expansive Nd-based compound is needed in the e-coating than in the Nd glass.

The Nd—F and/or Nd—X—F compound coating may be disposed on a surface of the enclosure/jacket, and the thickness of the coating should be sufficient to achieve the desired color filtering effect as described herein. The thickness may typically correspond to a range from about 0.5 to about 4.0 mg/cm$^2$, with a preferred thickness corresponding to a range from about 1.0 to about 2.5 mg/cm$^2$.

Although not intended to be limiting, besides using electrostatic coating, the Nd—F/Nd—X—F compound coating may be applied by, for example, spray coating, roller coating, meniscus or dip coating, stamping, screening, dispensing, rolling, brushing, bonding, or other method that can provide a coating of even thickness and satisfy other system requirements described herein.

In a further embodiment, to promote refraction of the light to achieve a white reflective appearance, the coating further may include an additive having a higher refractive index relative to the Nd—F and/or Nd—X—F compound(s). The additive can be selected from at least one of metal oxides and non-metal oxides, such as $TiO_2$, $SiO_2$ and $Al_2O_3$.

According to another embodiment, the resultant devices/lamps can exhibit improvement of light parameters using filtering with Nd—/Nd—X—F compounds/materials having intrinsic absorption in the visible region between about 530 nm and 600 nm to possibly enhance CSI (color saturation index), CRI (color rendering index), R9 (a color rendering value for a red color chip) revealness (lighting preference index, LPI) and the like. R9 is defined as one of 6 saturated test colors not used in calculating CRI. The "revealness" is a parameter of the emitted light based on a version of the LPI, which is described in co-pending, commonly owned International application PCT/US2014/054868, filed Sep. 9, 2014 (published as WO2015/035425 on Mar. 12, 2015), and hereby incorporated by reference in pertinent part.

Unless defined otherwise, technical and scientific terms used herein have the same meaning as is commonly understood by one having ordinary skill in the art to which this disclosure belongs. The terms "first", "second", and the like, as used herein, do not denote any order, quantity, or importance, but rather are employed to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof, as well as additional items. The terms "connected" and "coupled" are not restricted to physical or mechanical connections or couplings, and can include electrical and optical connections or couplings, whether direct or indirect.

Furthermore, the skilled artisan will recognize the interchangeability of various features from different embodiments. The various features described, as well as other known equivalents for each feature, can be mixed and matched by one of ordinary skill in this art, to construct additional systems and techniques in accordance with principles of this disclosure.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is to be understood that the foregoing description is intended to illustrate and not to limit the scope of the invention, which is defined by the scope of the appended claims. Other embodiments are within the scope of the following claims.

It is noted that various non-limiting embodiments described and claimed herein may be used separately, combined or selectively combined for specific applications.

Further, some of the various features of the above non-limiting embodiments may be used to advantage, without the corresponding use of other described features. The foregoing description should therefore be considered as merely illustrative of the principles, teachings and exemplary embodiments of this invention, and not in limitation thereof.

The invention claimed is:

1. An apparatus comprising:
 a light source, configured to generate a visible light having chromaticity coordinates of the light source in a clear center in a color space; and
 a light-transmissive envelope enclosing the light source and comprising a coating with a powder of a compound comprising elements of neodymium (Nd) and fluorine (F) and configured to provide a filtered light spectrum by filtering the generated visible light using the compound,
 wherein the compound comprising elements of neodymium (Nd) and fluorine (F) is one or more of: neodymium oxyfluoride, neodymium hydroxide fluoride, or Nd—X—F, wherein X is one or more selected from the group consisting of O, N, S, Cl, OH, Na, K, Al, Mg, Li, Ca, Sr, Ba and Y;
 wherein the filtered light spectrum having chromaticity coordinates in the color space being shifted from the clear center below a black-body locus and outside of a four-step MacAdam ellipse of the light source.

2. The apparatus of claim 1, wherein the light source comprises a light-generating element made of tungsten (W).

3. The apparatus of claim 1, wherein the apparatus comprises a modified-spectrum halogen incandescent lamp.

4. The apparatus of claim 3, wherein the modified-spectrum halogen incandescent lamp comprises an inert gas and halogen species in a capsule enclosed with the light-transmissive envelope.

5. The apparatus of claim 4, wherein the inert gas comprises at least one of xenon and krypton.

6. The apparatus of claim 1, wherein the light-transmissive envelope is made of a glass material.

7. The apparatus of claim 1, wherein the coating comprises a mixture of the powder of a compound comprising elements of neodymium (Nd) and fluorine (F), and one or more fluidizers.

8. The apparatus of claim 1, wherein the compound is at least one of NdOF and $Nd_4O_3F_6$.

9. The apparatus of claim 1, wherein the coating is deposited on an inner surface of the light-transmissive envelope.

10. The apparatus of claim 1, wherein the coating is applied to the light-transmissive envelope in an amount in a range from about 0.5 to about 4.0 mg/cm$^2$.

11. The apparatus of claim 1, wherein the coating is deposited onto the light-transmissive envelope by an electrostatic coating method.

12. The apparatus of claim 1, wherein the coating further comprises one or more color powders.

13. The apparatus of claim 12, wherein one of the one or more color powders is a blue color powder.

14. The apparatus of claim 1, wherein the coating further comprises a scattering additive having a higher refractive index than the compound, and wherein the additive is selected from metal oxides and non-metal oxides.

15. The apparatus of claim 1, wherein the light source comprises an LED chip within the envelope.

16. The apparatus of claim 1, wherein the coating is configured to provide enhancement of light parameters of the apparatus including one or more of color saturation index (CSI), color rendering index (CRI), color rendering value R9 and revealness (lighting preference index).

17. An apparatus comprising:
 a light source, configured to generate a visible light having first chromaticity coordinates of the light source in a color space; and
 a component enclosing the light source, the component having a coating comprising a powder of a compound comprising elements of neodymium (Nd) and fluorine (F) and configured to provide a filtered light spectrum having second chromaticity coordinates in the color space by filtering the generated visible light using the compound,
 wherein the compound is one or more of neodymium oxyfluoride, neodymium hydroxide fluoride, or Nd—X—F, wherein X is one or more selected from the group consisting of O, N, S, Cl, OH, Na, K, Al, Mg, Li, Ca, Sr, Ba and Y;
 wherein the filtered light spectrum having second chromaticity coordinates in the color space being shifted from the first color coordinates below a black-body locus and outside of a four-step MacAdam ellipse of the light source.

18. The apparatus of claim 17, wherein the light source comprises a light-generating element made of tungsten (W), arranged in a capsule comprising an inert gas and halogen species.

19. An apparatus comprising:
 a light source configured to generate a visible light having chromaticity coordinates of the light source in a clear center in a color space; and
 a light-transmissive envelope enclosing the light source, the envelope comprising a coating with a compound configured to provide a filtered light spectrum by filtering the generated visible light using the compound, wherein the compound comprises $Nd^{3+}$ ions and $F^-$ ions and the compound is selected from the group consisting of NdOF and $Nd_4O_3F_6$,
 wherein the light source is a halogen incandescent capsule comprising an inert gas and halogen species and the capsule is enclosed with the light-transmissive envelope,
 wherein the filtered light spectrum has chromaticity coordinates in the color space being shifted from the clear center below a black-body locus and outside of a four-step MacAdam ellipse of the light source.

* * * * *